United States Patent
Yang et al.

(10) Patent No.: US 11,071,191 B2
(45) Date of Patent: *Jul. 20, 2021

(54) EXTREME ULTRAVIOLET RADIATION SOURCE AND CLEANING METHOD THEREOF

(71) Applicant: Taiwan Semiconductor Manufacturing Co., Ltd., Hsinchu (TW)

(72) Inventors: Chi Yang, Taichung (TW); Sheng-Ta Lin, Miaoli County (TW); Shang-Chieh Chien, New Taipei (TW); Li-Jui Chen, Hsinchu (TW); Po-Chung Cheng, Zhongpu Shiang (TW)

(73) Assignee: TAIWAN SEMICONDUCTOR MANUFACTURING CO., LTD, Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/899,825

(22) Filed: Jun. 12, 2020

(65) Prior Publication Data

US 2020/0314989 A1 Oct. 1, 2020

Related U.S. Application Data

(63) Continuation of application No. 16/250,026, filed on Jan. 17, 2019, now Pat. No. 10,687,410.

(60) Provisional application No. 62/703,946, filed on Jul. 27, 2018.

(51) Int. Cl.
*H05G 2/00* (2006.01)
*B08B 5/02* (2006.01)
*B01D 46/10* (2006.01)
*G03F 7/20* (2006.01)
*H01L 21/027* (2006.01)

(52) U.S. Cl.
CPC .......... *H05G 2/003* (2013.01); *B01D 46/106* (2013.01); *B08B 5/02* (2013.01); *G03F 7/2004* (2013.01); *G03F 7/70033* (2013.01); *G03F 7/70925* (2013.01); *H05G 2/008* (2013.01); *B01D 2275/204* (2013.01); *B01D 2279/45* (2013.01); *H01L 21/0274* (2013.01)

(58) Field of Classification Search
USPC .................................................... 250/504 R
See application file for complete search history.

(56) References Cited

U.S. PATENT DOCUMENTS

| 3,581,474 A * | 6/1971 | Kent ...................... B01D 47/06 96/257 |
| 6,555,834 B1 | 4/2003 | Loopstra |
| 6,753,941 B2 | 6/2004 | Visser |

(Continued)

*Primary Examiner* — Phillip A Johnston
(74) *Attorney, Agent, or Firm* — McClure, Qualey & Rodack, LLP

(57) ABSTRACT

An extreme ultraviolet radiation source is provided, including a vessel and a gas scrubber. The vessel has a gas inlet from which a cleaning gas is supplied into the vessel and a gas outlet from which the cleaning gas exits the vessel. The gas scrubber is disposed within the vessel, arranged such that the cleaning gas leaves the vessel through the gas outlet after flowing through the gas scrubber. The gas scrubber has a number of gas passages to allow the cleaning gas to flow through, and the sizes of the gas passages vary according to the distance between each of the gas passages and the gas outlet.

20 Claims, 10 Drawing Sheets

(56) References Cited

U.S. PATENT DOCUMENTS

| | | | |
|---|---|---|---|
| 6,946,018 B2 * | 9/2005 | Hogan | B01D 45/12 |
| | | | 261/88 |
| 7,655,925 B2 * | 2/2010 | Bykanov | G03F 7/70916 |
| | | | 250/436 |
| 7,986,395 B2 | 7/2011 | Chang et al. | |
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 8,940,079 B2 * | 1/2015 | McClelland | B01D 53/34 |
| | | | 95/213 |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 10,687,410 B2 * | 6/2020 | Yang | H05G 2/008 |
| 2019/0155179 A1 | 5/2019 | Wu et al. | |

* cited by examiner

EXTREME ULTRAVIOLET RADIATION SOURCE AND CLEANING METHOD THEREOF

CROSS REFERENCE TO RELATED APPLICATIONS

This application is a Continuation application of U.S. patent application Ser. No. 16/250,026, filed on Jan. 17, 2019, now U.S. Pat. No. 10,687,410, which claims priority of U.S. Provisional Patent Application No. 62/703,946, filed on Jul. 27, 2018, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering the associated costs. Such scaling down has also increased the complexity of IC processing and manufacturing. For these advances to be realized, similar developments in IC processing and manufacturing are needed.

For example, the need to perform higher-resolution lithography processes grows. One lithography technique is extreme ultraviolet lithography (EUVL). The EUVL employs scanners using light in the extreme ultraviolet (EUV) region, having a wavelength of about 1-100 nm. EUV scanners use reflective rather than refractive optics, i.e., mirrors instead of lenses. One type of EUV light source is laser-produced plasma (LPP). LPP technology produces EUV light by focusing a high-power laser beam onto small tin droplets to form highly ionized plasma that emits EUV radiation with a peak of maximum emission at 13.5 nm. The EUV light is then collected by an optical collector and reflected by optics towards a lithography exposure object, e.g., a wafer. The EUV light is produced in a radiation source vessel maintained in a vacuum environment since the air absorbs the EUV light.

Although existing EUV techniques have been adequate for their intended purposes, they have not been entirely satisfactory in all respects.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

Figure 1:
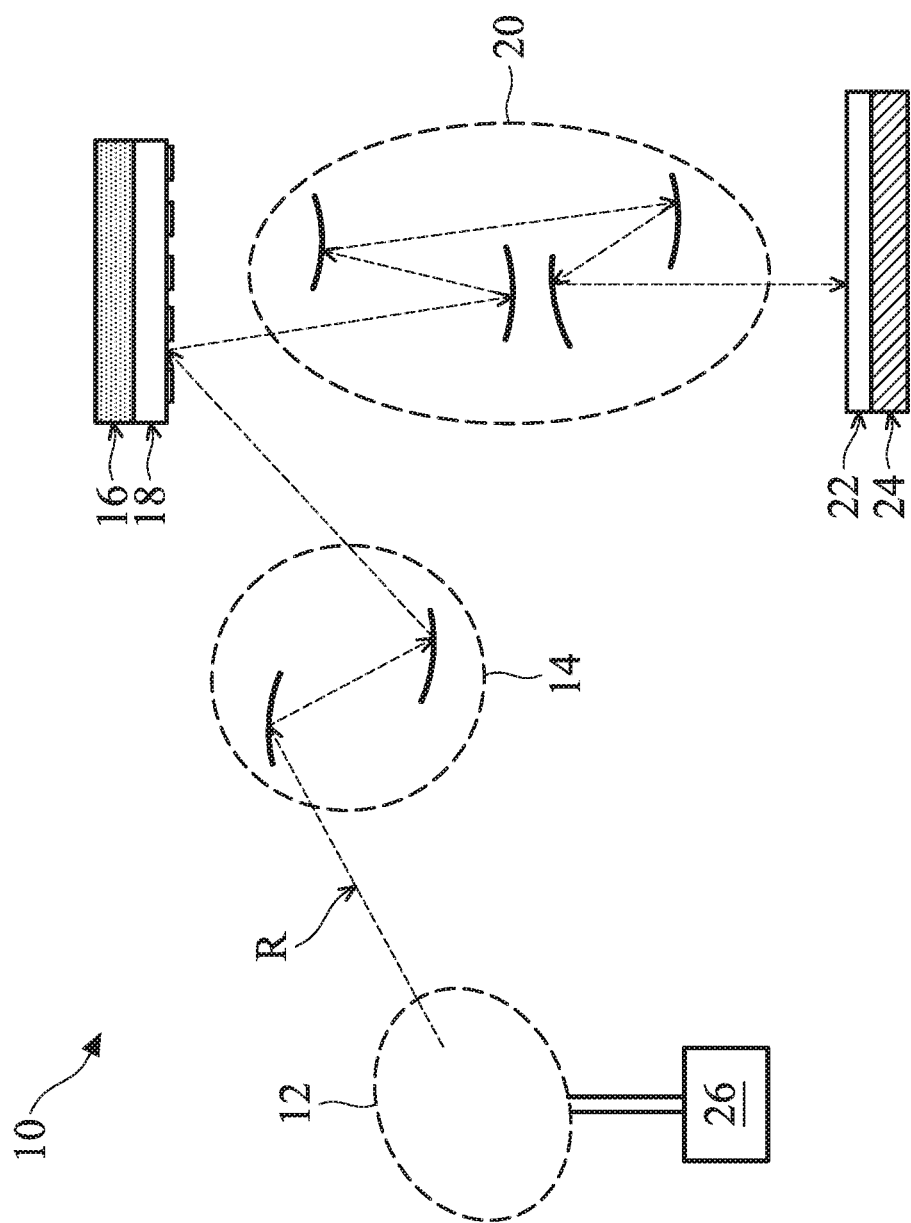
FIG. 1 is a schematic view of an extreme ultraviolet (EUV) lithography system with a laser produced plasma (LPP) EUV radiation source, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a schematic and diagrammatic view of a lithography system 10, in accordance with some embodiments. The lithography system 10 may also be generically referred to as a scanner that is operable to perform lithography exposing processes with respective radiation source and exposure mode.

In the present embodiment, the lithography system 10 is an extreme ultraviolet (EUV) lithography system designed to expose a resist layer by EUV light. The resist layer is a suitable material sensitive to EUV light. The EUV lithography system 10 employs a radiation source 12 to generate EUV light, such as EUV light having a wavelength ranging between about 1 nm and about 100 nm. In one particular example, the radiation source 12 generates EUV light with a wavelength centered at about 13.5 nm. Accordingly, the radiation source 12 is also referred to as an EUV radiation source 12. In the present embodiment, the EUV radiation source 12 utilizes a mechanism of laser-produced plasma (LPP) to generate the EUV radiation, which will be further described later.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16 of the lithography system 10, particularly to a mask 18 secured on the mask stage 16. In the present embodiment where the radiation source 12 generates light in the EUV wavelength range, reflective optics is employed.

The mask stage 16 is configured to secure the mask 18. In some embodiments, the mask stage 16 includes an electrostatic chuck (e-chuck) to secure the mask 18. This is because that gas molecules absorb EUV light and the lithography system for the EUV lithography patterning is maintained in a vacuum environment to avoid the EUV intensity loss. In the present disclosure, the terms of mask, photomask, and reticle are used interchangeably.

In the present embodiment, the mask 18 is a reflective mask. One exemplary structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes a reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask 18 may further include a capping layer, such as ruthenium (Ru), disposed on the ML for protection. The mask 18 further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The lithography system 10 also includes a projection optics module (or projection optics box (POB)) 20 for imaging the pattern of the mask 18 onto a semiconductor substrate 22 secured on a substrate stage 24 of the lithography system 10. In the present embodiment, the POB 20 has reflective optics for projecting the EUV light. The EUV light directed from the mask 18, which carries the image of the pattern defined on the mask 18, is collected by the POB 20. The illuminator 14 and the POB 20 are collectively referred to an optical module of the lithography system 10.

In the present embodiment, the semiconductor substrate 22 is a semiconductor wafer made of silicon or other semiconductor materials. Alternatively or additionally, the semiconductor substrate 22 may include other elementary semiconductor materials such as germanium (Ge). In some embodiments, the semiconductor substrate 22 is made of a compound semiconductor such as silicon carbide (SiC), gallium arsenic (GaAs), indium arsenide (InAs), or indium phosphide (InP). In some embodiments, the semiconductor substrate 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor substrate 22 may be a silicon-on-insulator (SOI) or a germanium-on-insulator (GOI) substrate.

In addition, the semiconductor substrate 22 may have various device elements. Examples of device elements that are formed in the semiconductor substrate 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-passage and/or n-passage field-effect transistors (PFETs/NFETs), etc.), diodes, and/or other applicable elements. Various processes are performed to form the device elements, such as deposition, etching, implantation, photolithography, annealing, and/or other suitable processes.

In the present embodiment, the semiconductor substrate 22 is coated with a resist layer sensitive to the EUV light. Various components including those described above are integrated together and are operable to perform lithography exposing processes.

The lithography system 10 may further include other modules or be integrated with (or be coupled with) other modules. In the present embodiment, the lithography system 10 includes a gas supply module 26 designed to provide hydrogen gas to the radiation source 12. The hydrogen gas helps reduce contamination in the radiation source 12, which will be further described later.

Figure 2:
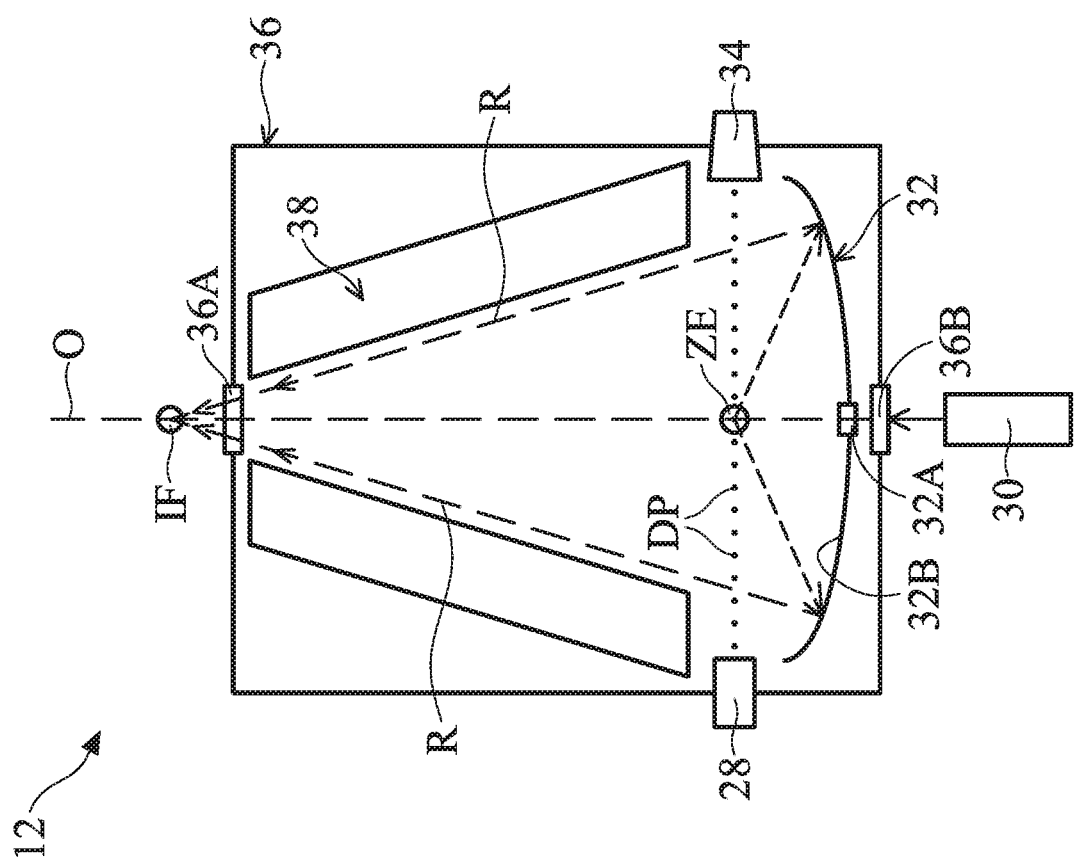
FIG. 2 is a schematic view of the EUV radiation source in the EUV lithography system of FIG. 1, in accordance with some embodiments.

FIG. 2 is a schematic view illustrating partial components of the radiation source 12 in the EUV lithography system 10 of FIG. 1, in accordance with some embodiments. The radiation source 12 employs a laser produced plasma (LPP) mechanism to generate plasma and further produce EUV light from the plasma.

As shown in FIG. 2, the EUV radiation source 12 includes a droplet generator 28 which is configured to generate and deliver target droplets DP. In some embodiments, the target droplets DP are tin (Sn) droplets. In some examples, the tin droplets DP each may have a diameter about 30 microns (μm) and are generated at a rate about 50 kilohertz (kHz). The tin droplets DP are introduced into a zone of excitation ZE in the radiation source 12 at a speed about 70 meters per second (m/s) in some examples. Other material may also be used for the target droplets DP, for example, a tin-containing liquid material such as eutectic alloy containing tin, lithium (Li), and xenon (Xe).

The radiation source 12 also includes a laser source 30. The laser source 30 may include a carbon dioxide ($CO_2$) laser source, a neodymium-doped yttrium aluminum garnet (Nd:YAG) laser source, or other suitable laser source to generate a laser beam. Although not shown, the laser beam generated by the laser source 30 may be directed by laser guide optics to a focus lens to focus the laser beam, and then introduced into the radiation source 12. The laser beam is further directed through an output window 32A integrated with an optical collector 32 disposed in the radiation source 12. The laser beam is directed to heat the target droplets DP, such as tin droplets, in the zone of excitation ZE, thereby generating high-temperature plasma, which further produces EUV light R.

The pulses of the laser source 30 and the droplet generating rate of the droplet generator 28 may be controlled to be synchronized such that the target droplets DP receive peak powers consistently from the laser pulses of the laser source 30. In some embodiments, the radiation source 12 may employ a dual LPP mechanism where the laser source 30 is a cluster of multiple laser sources. For example, the laser source 30 may include a pre-heat laser source and a main laser source, which produce pre-heat laser beam and main laser beam, respectively. The pre-heat laser beam has a smaller spot size and less intensity than the main laser beam, and is used for pre-heating the target droplet DP to create a low-density target plume, which is subsequently reheated by the main laser beam, generating increased emission of EUV light R.

In some embodiments, the laser beam generated by the laser source 30 may or may not hit every target droplet DP. For example, some target droplets DP may be purposely missed by the laser beam. In the present embodiment, the radiation source 12 also includes a droplet catcher 34 which is installed opposite the droplet generator 28 and arranged in the desired travel path of the target droplets DP. The droplet catcher 34 is configured to catch any target droplets that are missed by the laser beam.

As shown in FIG. 2, EUV light R may be collected by the collector 32. The collector 32 further reflects and focuses the EUV light R to an intermediate focus IF, from where the EUV light R passes into the illuminator 14 of the lithography system 10 (FIG. 1) for the lithography exposure processes. The collector 32 may be designed with proper coating materials and shape. In some embodiments, the collector 32 is designed to have an ellipsoidal geometry. In some embodiments, the coating material of the collector 32 is similar to the reflective multilayer of the EUV mask 18. For example, the coating material of the collector 32 includes a ML (such as a plurality of Mo/Si film pairs) and may further include a capping layer (such as Ru) coated on the ML to substantially reflect the EUV light. In some embodiments, the collector 32 may further include a grating structure designed to effectively scatter the EUV light directed onto the collector 32. For example, a silicon nitride layer is coated on the collector 32 and is patterned to have a grating pattern.

The radiation source 12 further includes a vessel 36 within which a controlled environment is provided, the zone of excitation ZE and the collector 32 being located within the vessel 36. Control of the environment may, for example, include providing the desired vacuum within the vessel 36 and/or providing one or more desired gases at the desired pressures (the desired pressures may be significantly below atmospheric pressure and may thus be considered to be a vacuum). An opening (or window) 36A is provided at one end of the vessel 36, the position of the opening 36A substantially corresponding to the position of the intermediate focus IF in order to allow the reflected EUV light R to pass through the intermediate focus IF. Another opening (or window) 36B is provided at an opposite end of the vessel 36 in order to allow laser beam from the laser source 30 into the vessel 36.

In the present embodiment, the vessel 36 is cylindrical (see FIGS. 2 and 5) and has a central axis (or optical axis) O passing through the zone of excitation ZE and the intermediate focus IF. As shown in FIG. 2, the vessel 36 (i.e., a cylindrical housing) also has an inner wall 38 formed therein to limit the propagation region of the EUV light R within the vessel 36. For example, the inner wall 38 may be formed or configured to have a generally frustoconical shape around the central axis O so as to efficiently direct and focus the EUV light R to the intermediate focus IF.

In some embodiments, a number of vanes (not shown) may also be formed on and distributed around the inner wall 38 to provide the target droplets receiving surfaces. It should be understood that some target droplets DP may not always travel in the desired path, and when they are incident on the inner wall 38, the vanes retain the liquid target droplets DP. The vanes may be heated to above the melting temperature of the material of target droplets DP using any suitable manner of heating. In addition, a gutter (not shown) may be provided at one end of the vanes and connected to a drain (not shown) in order to recover the unused target droplets DP.

In such an EUV radiation source, the plasma caused by the laser application creates physical debris, such as ions, gases and atoms of the target droplets, as well as the desired EUV radiation. It is desired to prevent the accumulation of material on the coating surface 32B of the collector 32 (it may reduce the lifetime of the collector 32 and the productivity of the lithography system 10) and also to prevent physical debris exiting the vessel 36 and entering the subsequent exposure tool (it may reduce the yield of the lithography system 10).

Figure 3:
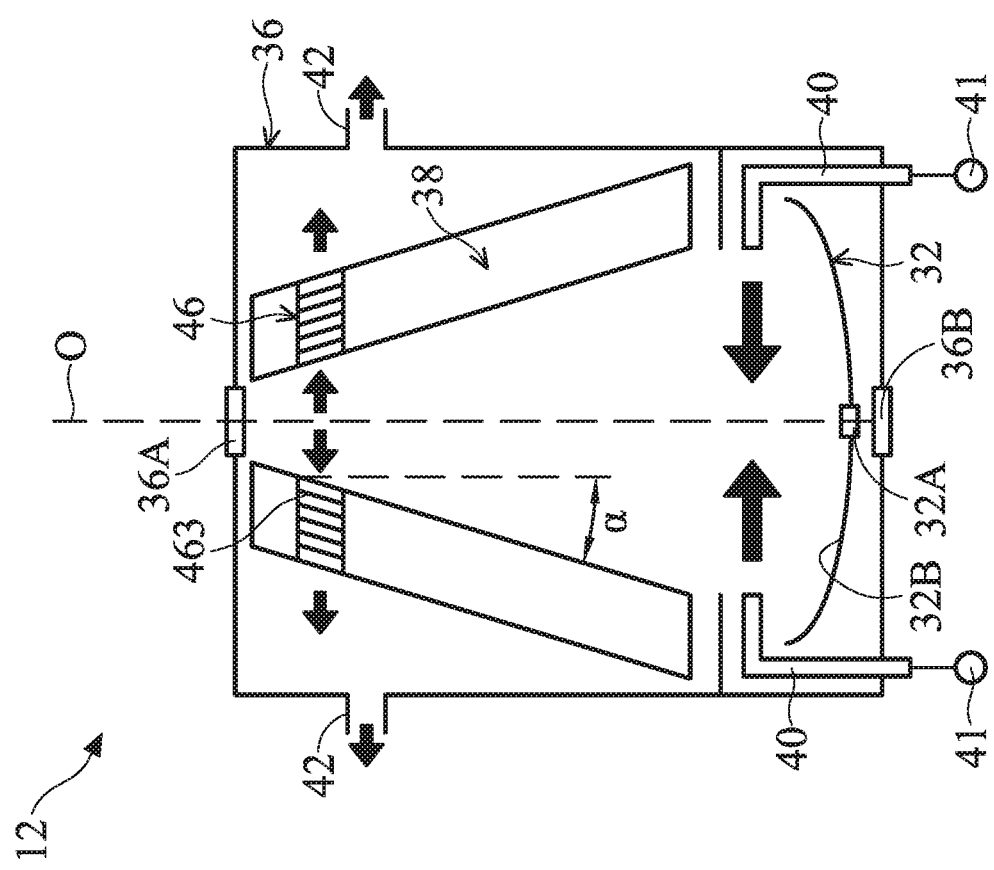
FIG. 3 is a schematic view illustrating a self-cleaning mechanism of the EUV radiation source of FIG. 2, in accordance with some embodiments.

FIG. 3 is a schematic view illustrating a self-cleaning mechanism of the radiation source 12 of FIG. 2, in accordance with some embodiments. As shown, a cleaning gas (also called a buffer gas) depicted in outline arrows, is supplied from two gas supplies 40, such as gas pipes, around the edges of the collector 32 to clean the coating surface 32B thereof. The gas supplies 40 each is coupled to a gas source 41 providing the cleaning gas. In some other embodiments, the cleaning gas can be supplied through one or more than two gas supplies toward the collector 32, around the edges of the collector 32, and/or in any suitable location within the vessel 36, as long as the supplied cleaning gas can successfully flow over the coating surface 32B of the collector 32. In some embodiments, the cleaning gas is $H_2$, He, Ar, N or another inert gas. In certain embodiments, $H_2$ is used as H radicals generated by ionization of the cleaning gas, which can be used for cleaning purposes.

Hydrogen gas has low absorption to EUV radiation. Hydrogen gas that reaches the coating surface 32B of the collector 32 reacts chemically with the metal of the target droplets DP (FIG. 2) forming a hydride, e.g., metal hydride. When tin (Sn) is used as the target droplets DP, stannane ($SnH_4$), which is a gaseous byproduct of the EUV generation process, is formed. The gaseous $SnH_4$ is then pumped out through one or more gas outlets 42 of the vessel 36. In the present embodiment, two gas outlets 42 are disposed on opposite sides of the vessel 36. A vacuum pump 44 (see FIG. 5) or other suitable pump can be coupled to the two gas outlets 42 for discharging the cleaning gas out of the vessel 36.

A gas scrubber 46 may also be disposed within the vessel 36 for removing contaminants (e.g., large size debris) from the cleaning gas (e.g., $H_2$) before it leaves the vessel 36 through the gas outlets 42 and then enters the vacuum pump 44. In some embodiments, the gas scrubber 46 is arranged on the flow path of the cleaning gas within the vessel 36. In the present embodiment, as shown in FIG. 3, the gas scrubber 46 is positioned in the inner wall 38 of the vessel 36 and allows the cleaning gas, after flowing through the coating surface 32B of the collector 32, to pass through and then exit the vessel 36 through the gas outlets 42.

Figure 4:
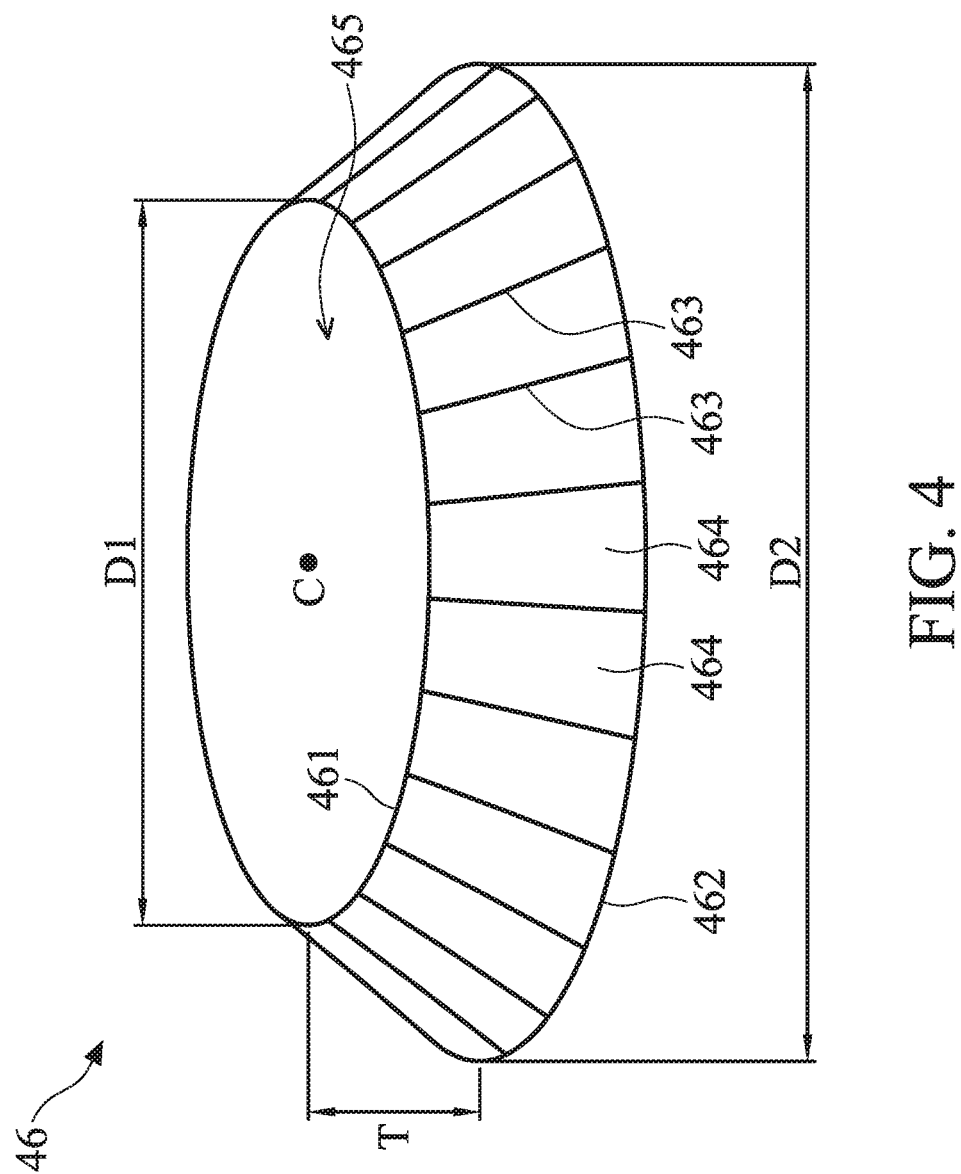
FIG. 4 is a perspective view of a gas scrubber in FIG. 3, in accordance with some embodiments.

FIG. 4 is a perspective view of the gas scrubber 46 in FIG. 3, in accordance with some embodiments. As shown, the gas scrubber 46 is a ring structure including an upper ring 461, a lower ring 462, and a number of ribs 463. The upper ring 461 and lower ring 462 are both substantially circular, and the diameter D1 of upper ring 461 can be less than the diameter D2 of lower ring 462. For example, the diameter D1 may be about 200 mm to 400 mm, and the diameter D2 may be about 200 mm to 500 mm. The ribs 463 are connected between the parallel upper ring 461 and the lower ring 462 and distributed along the circumference of the ring structure. A number of gas passages (or openings) 464 are formed between the ribs 463. In the present embodiment, each of the gas passages 464 is trapezoidal. However, the gas passages 464 can also be designed to have another suitable shape (e.g., parallelogram, triangle, etc.) in some examples. The gas scrubber 46 may have a uniform thickness T along its circumference (between the upper ring 461 and the lower ring 462), for example between about 8 mm and about 12 mm, in some examples.

Referring to FIG. 3 and FIG. 4, while installed in the inner wall 38 of the vessel 36, the center C of the gas scrubber 46 (i.e., the centers of the upper ring 461 and the lower ring 462) is aligned with the central axis O of the vessel 36 so that the gas scrubber 46 is disposed around the central axis O. Accordingly, the EUV light R reflected from the collector 32 can pass through an opening 465 of the gas scrubber 46 to the intermediate focus IF (FIG. 2). Furthermore, during operation of the vacuum pump 44 (FIG. 4), the cleaning gas within the vessel 36 can pass through the gas passages 464 of the gas scrubber 46 (while the contaminants in the cleaning gas are filtered) and then exit the vessel 36 through the gas outlets 42. In some embodiments, an angle α that is greater than 0 degrees (e.g., about 1 to 60 degrees depending on the various slopes of the inner wall 38) is formed between each of the ribs 463 of the gas scrubber 46 and the central axis O.

It should be noted that the distribution of the cleaning gas flow within the vessel 36 affects the result of the self-cleaning process on the collector 32 (FIG. 3). If the cleaning gas flow is not uniformly distributed within the vessel 36, contaminants (e.g., debris and/or other types of byproducts) accumulated at certain locations of the coating surface 32B of the collector 32 may not be successfully removed by the cleaning gas (i.e., the result of the self-cleaning process is not good). As a result, the lifetime of the collector 32 and the productivity of the lithography system 10 are reduced.

Figure 5:
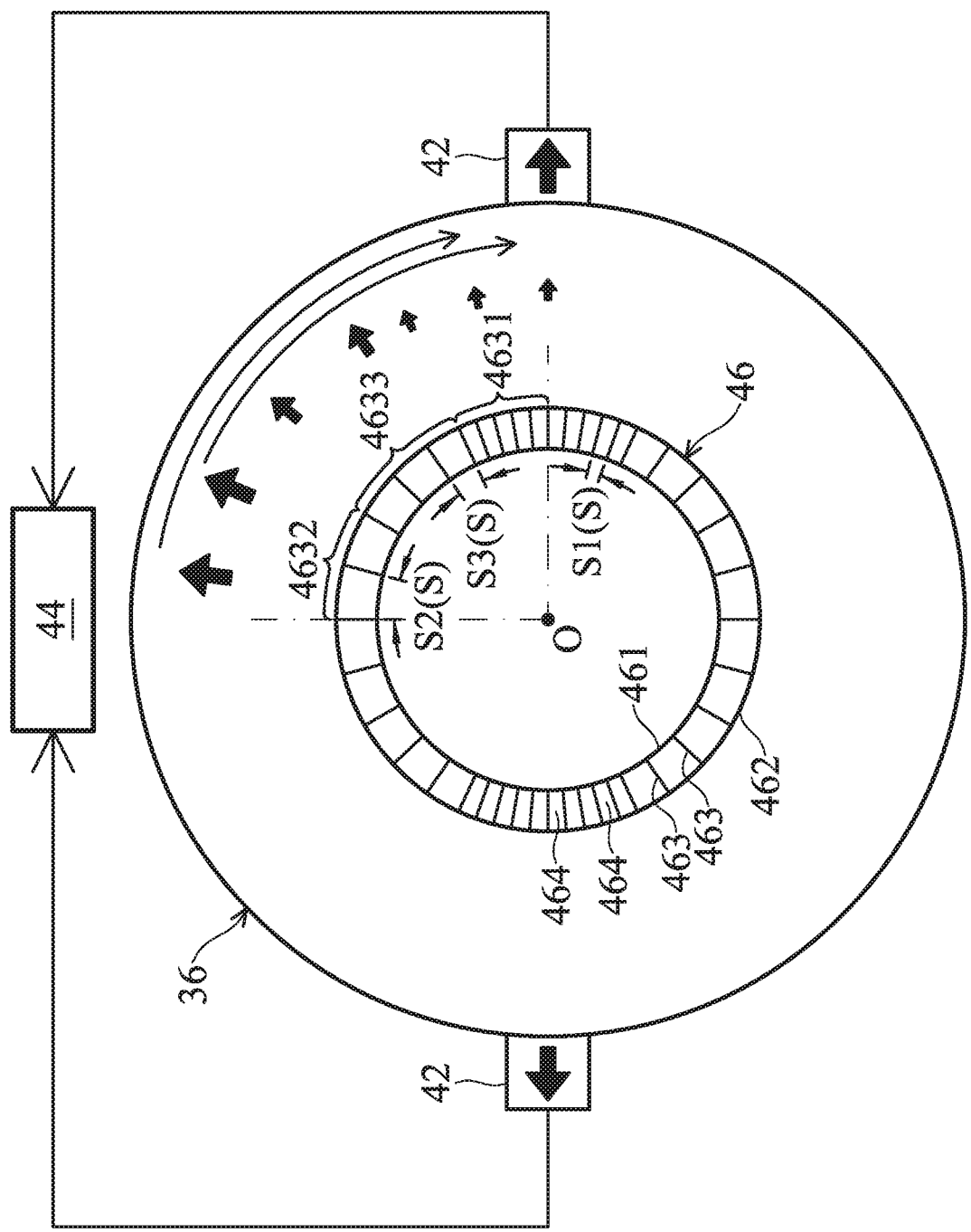
FIG. 5 is a schematic top view showing the gas scrubber having different pitches between ribs at different locations to improve the uniformity of the distribution of the cleaning gas flow within the vessel, in accordance with some embodiments.

FIG. 5 is a schematic top view showing the gas scrubber 46 having different pitches between ribs 463 at different locations to improve the uniformity of the distribution of the cleaning gas flow within the vessel 36, in accordance with some embodiments. For the sake of simplicity, only the gas scrubber 46 within the vessel 36 is depicted.

In the present embodiment, as shown in FIG. 5, two gas outlets 42 are located on opposite sides of the cylindrical vessel 36. It should be understood that the flow rate of the cleaning gas may vary due to the difference in distance from the gas outlets 42. For example, the cleaning gas close to the gas outlets 42 may have a larger flow rate (because of the greater suction) than the cleaning gas away from the gas outlets 42 (when the ribs 463 are uniformly distributed along the circumference of the gas scrubber 46), resulting in an uneven distribution of the cleaning gas flow within the vessel 36.

To address this, the gas scrubber 46 in the present embodiment employs a design with different pitches between ribs 463 at different locations in the circumferential direction of the gas scrubber 46. As shown in FIG. 5, the distribution of the ribs 463 of the gas scrubber 46 close to the gas outlets 42 is dense, while the distribution of the ribs 463 of the gas scrubber 46 away from the gas outlets 42 is sparse. In other words, the pitches S formed between the ribs 463 close to the gas outlets 42 are smaller than the pitches formed between the ribs 463 away from the gas outlets 42 (i.e., the size (or width) of the gas passages 464 close to the gas outlets 42 are smaller than the size (or width) of the gas passages 464 away from the gas outlets 42).

The ribs 463 of the gas scrubber 46 may also have gradually increasing pitches from those close to (the closet) one of the gas outlets 42 to those away from the (the closet) gas outlet 42. For example, in the present embodiment shown in FIG. 5, the ribs 463 of the gas scrubber 46 have three different pitches in the circumferential direction. For illustration, the following description refers to only one quarter section of the gas scrubber 46 (e.g., the upper right section of the gas scrubber 46 depicted in FIG. 5). The ribs 463 comprise a number of first ribs 4631 close to one of the gas outlets 42 (e.g., the shown right gas outlet 42), a number of second ribs 4632 away from the gas outlet 42, and a number of third ribs 4633 between the first ribs 4631 and the second ribs 4632. A first pitch S1 is formed between two adjacent first ribs 4631, a second pitch S2 is formed between two adjacent second ribs 4632, and a third pitch S3 is formed between two adjacent third ribs 4633. The third pitch S3 is less than the second pitch S2 and greater than the first pitch Si (i.e., S2>S3>S1).

In some other embodiments, the ribs 463 of the gas scrubber 46 may have two or more than three different pitches. In some embodiments, the ratio of the pitch formed between the ribs 463 close to (the closet) one of the gas outlets 42 to the pitch formed between the ribs 463 away from the gas outlet 42 can be from 1:1.1 to 1:2 based on actual requirements.

In some embodiments, the size of the gas passage 464 that is farthest from the gas outlet 42 (i.e., the size of the maximum gas passage 464) is about twice the size of the gas passage 464 that is closest to the gas outlet 42 (i.e., the size of the minimum gas passage 464). For example, the size of the maximum gas passage 464 is about 1 cm, and the size of the minimum gas passage 464 is about 5 mm. However, other sizes of the maximum gas passage 464 and the minimum gas passage 464 (as well as other ratios therebetween) can also be chosen in other examples.

With the above design of gas scrubber 46, the flow rate of the cleaning gas away from the gas outlets 42 is increased (as indicated by the larger outline arrows in FIG. 5) and/or the flow rate of the cleaning gas close to the gas outlets 42 is reduced (as indicated by the smaller outline arrows in FIG. 5) so that the distribution of the cleaning gas flow within the vessel 36 is improved. As a result, the result of the self-cleaning process on the collector 32 is also improved, increasing the lifetime of the collector 32 and the productivity of the lithography system 10.

Figure 6A:
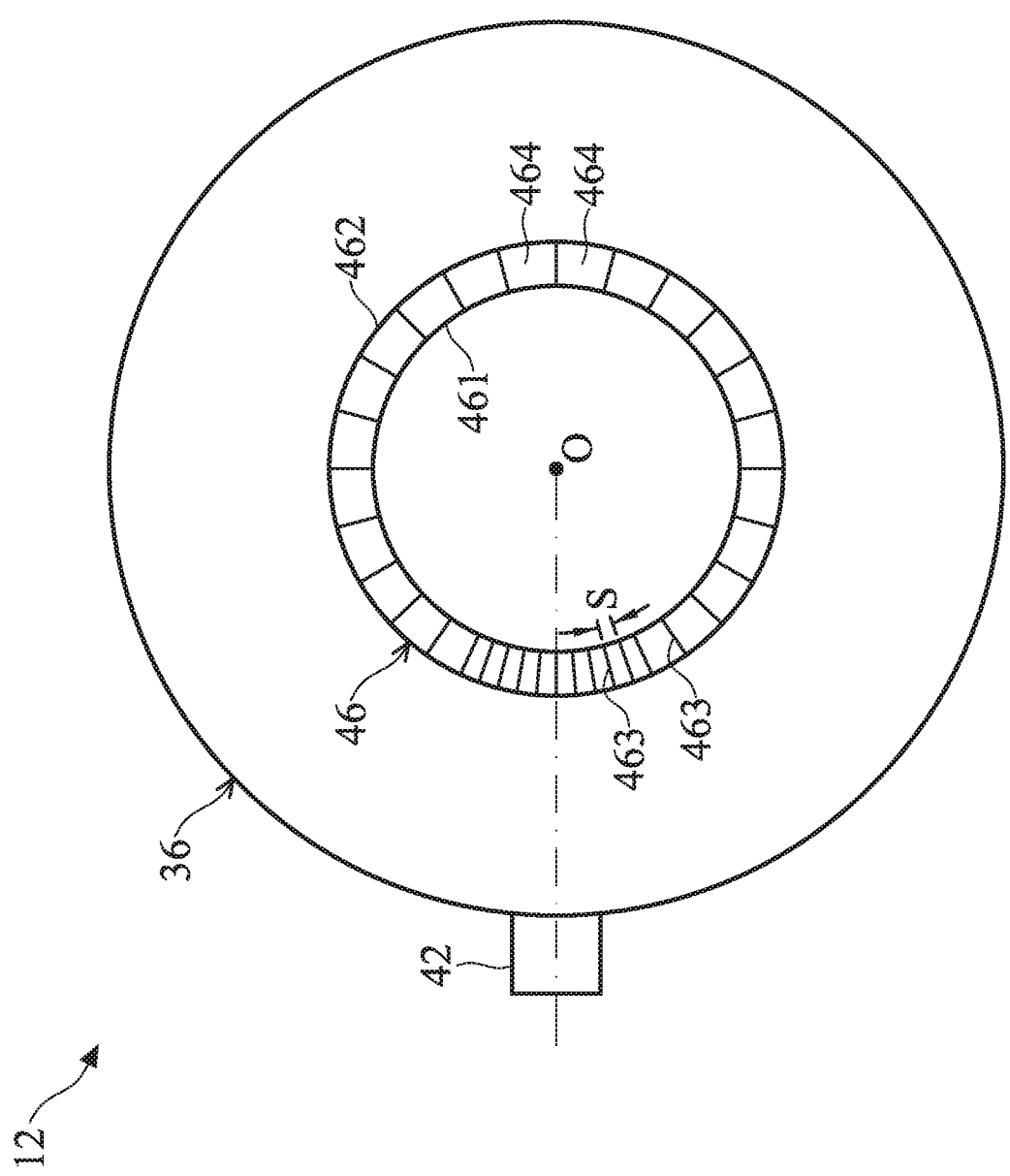
FIGS. 6A to 6C are schematic top views showing different distributions of the ribs of the gas scrubber, in accordance with some embodiments.
Figure 6B:
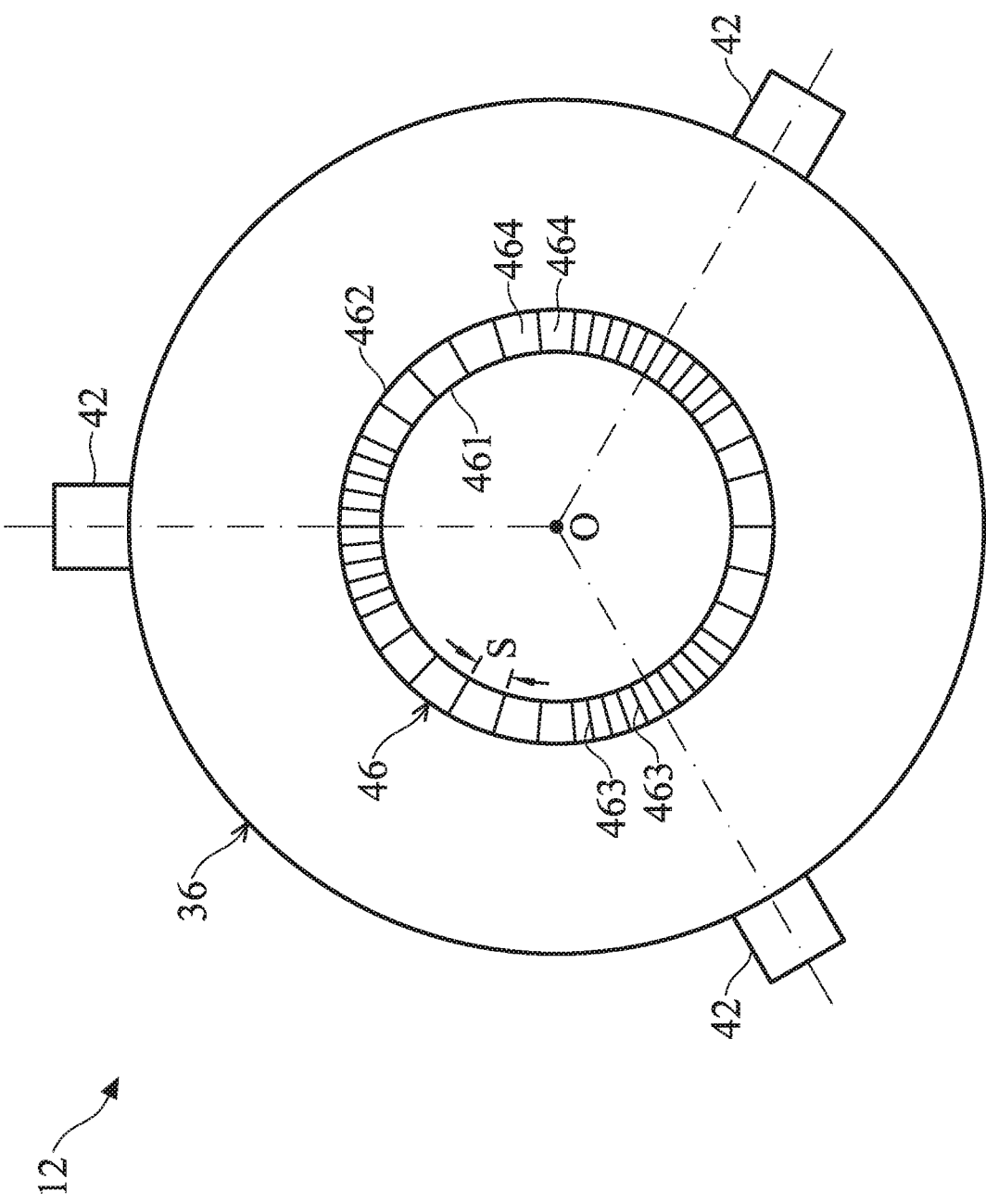
Figure 6C:
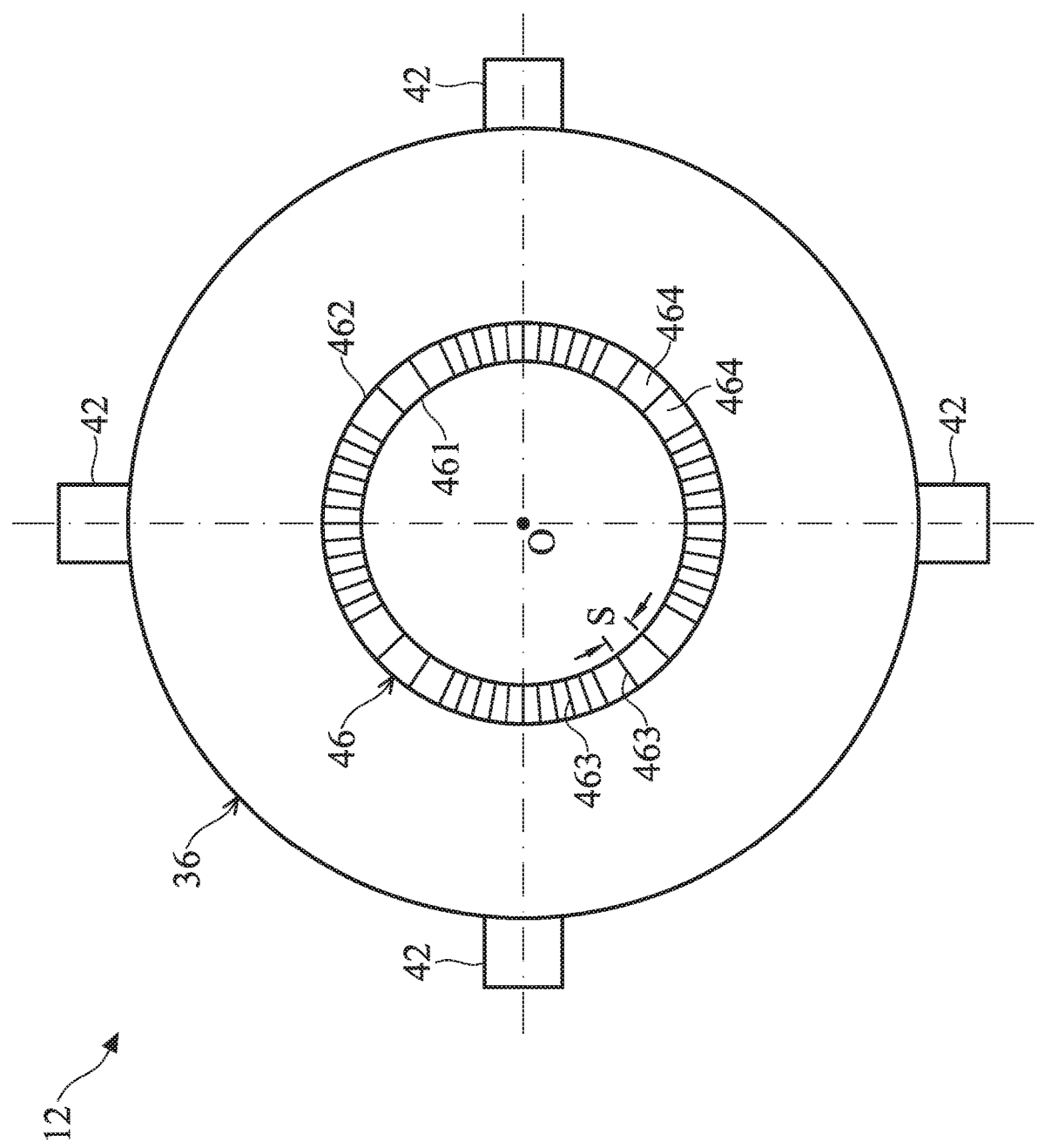

It should be appreciated that many variations and modifications can be made to embodiments of the disclosure. For example, the number and location of the gas outlets 42 may vary, and the distribution of the ribs 463 of the gas scrubber 46 can be changed accordingly. FIGS. 6A to 6C are schematic top views showing different distributions of the ribs 463 of the gas scrubber 46, in accordance with some other embodiments. As shown in FIG. 6A, there is single gas outlet 42 formed on one side of the vessel 36, and the pitches S formed between the ribs 463 close to the gas outlet 42 are smaller than the pitches S formed between the ribs 463 away from the gas outlet 42. As shown in FIGS. 6B and 6C, there are three or four gas outlets 42 formed at equal intervals around the vessel 36, and the pitches S formed between the ribs 463 close to the gas outlets 42 are smaller than the pitches S formed between the ribs 463 away from the gas outlets 42. The ratio of the pitch formed between the ribs 463 close to the closet gas outlet 42 to the pitch formed between the ribs 463 away from the closet gas outlet 42 can be from 1:1.1 to 1:2 in some embodiments.

In some embodiments, contaminants can easily accumulate at certain locations of the coating surface 32B of the collector 32 (FIG. 2) and are difficult to remove. The gas scrubber 46 may further include a movable shielding member that is configured to cover some gas passages 464 to change the distribution of the cleaning gas flow within the vessel 36 so that the contaminants accumulated on the collector 32 can be successfully removed by the cleaning gas.

Figure 7:
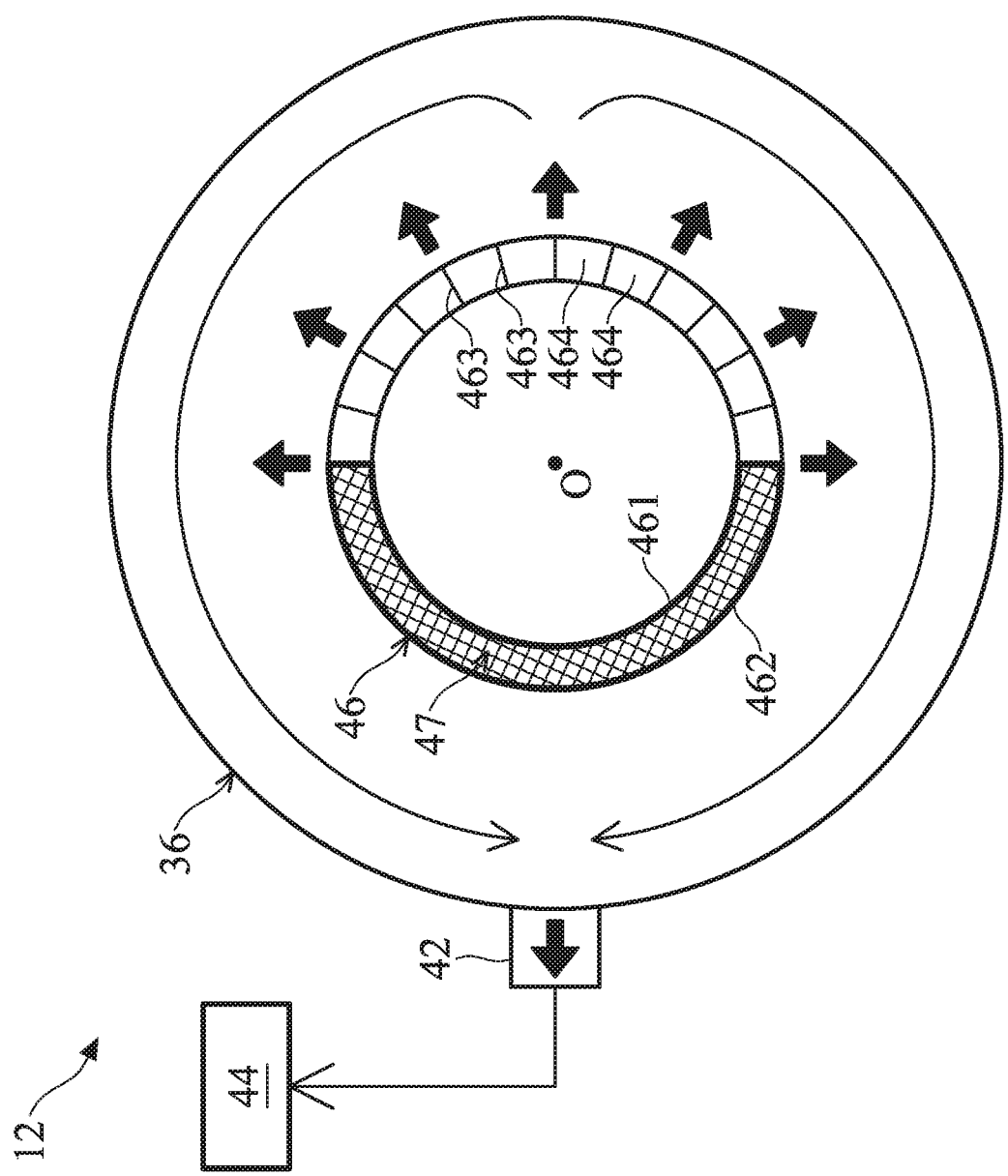
FIG. 7 is a schematic view showing that the gas scrubber includes a shielding member to cover some gas passages, in accordance with some embodiments.

For example, FIG. 7 is a schematic view showing that the gas scrubber 46 includes a shielding member 47 to cover the gas passages 464 on the left half section of the gas scrubber 46, in accordance with some embodiments. It should be understood that the cleaning gas does not flow through the gas passages 464 on the left half section of the gas scrubber 46 blocked by the shielding member 47, so that the flow rate of the cleaning gas passing through the gas passages 464 on the right half section of the gas scrubber 46 can be increased. Accordingly, a large amount of the cleaning gas flows through the right half of the coating surface 32B of the collector 32 on where contaminants can easily accumulate, thereby successfully removing the contaminants accumulated on the collector 32.

In some embodiments, one or more shielding members 47 can be movably mounted on the circumference of the gas scrubber 46 to cover gas passages 464 at any location as desired (not limited to the embodiments shown in FIG. 7). For example, the shielding member(s) 47 can have any suitable length and/or shape according to actual requirements. The shielding member(s) 47 may be movably connected between the upper ring 461 and the lower ring 462 by any suitable means, such as slide rail and slider. The shielding member(s) 47 can be removed from the gas scrubber 46 when it is not used.

Figure 8:
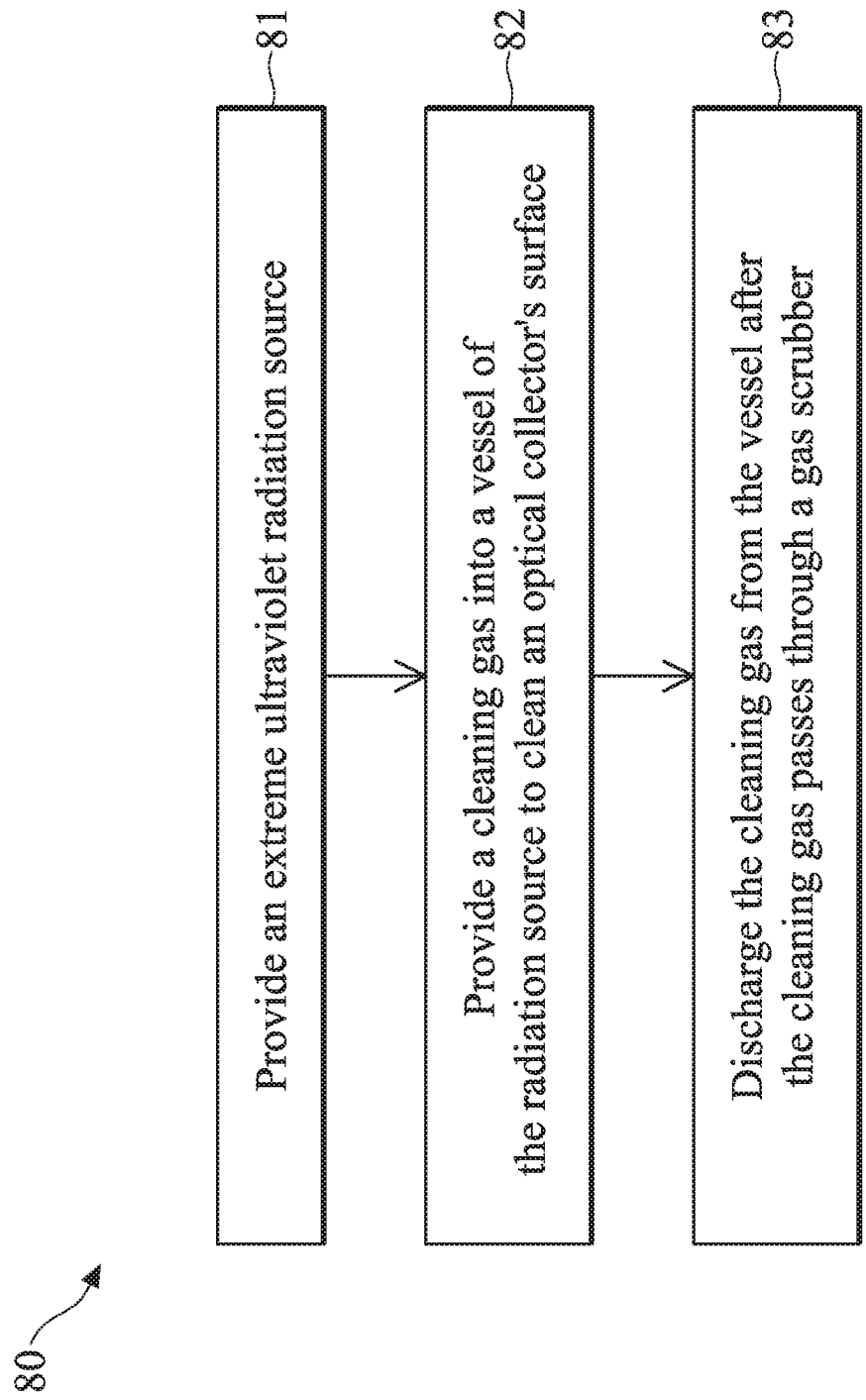
FIG. 8 is a simplified flowchart of a method of cleaning an extreme ultraviolet radiation source, in accordance with some embodiments.

Next, referring to FIG. 8, which is a simplified flowchart of a method 80 of cleaning an extreme ultraviolet radiation source, in accordance with some embodiments. The cleaning method 80 includes operation 81, in which an extreme ultraviolet radiation source is provided. In some embodiments, the extreme ultraviolet radiation source is the radiation source 12 described above with reference to FIGS. 2-6, including a vessel 36 having at least one gas supply 46 and at least one gas outlet 42, a collector 32 disposed within the vessel 36, and a gas scrubber 46 disposed within the vessel 36 and on the flow path of the cleaning gas. The gas scrubber 46 may have different pitches between ribs 463 at different locations. The distribution of the ribs 463 of the gas scrubber 46 close to the gas outlet 42 is dense, while the distribution of the ribs 463 of the gas scrubber 46 away from the gas outlet 42 is sparse.

The cleaning method 80 further includes operation 82, in which a cleaning gas is provided into the vessel to clean a surface of the collector. In some embodiments, the cleaning gas is supplied from the gas supply 46 into the vessel 36 to clean the coating surface 32B of the collector 32, as shown in FIG. 3. The cleaning method 80 also includes operation 83, in which the cleaning gas is discharged from the vessel after the cleaning gas passes through the gas scrubber. In some embodiments, during operation of a vacuum pump 44 (FIG. 4), the cleaning gas within the vessel 36 can pass through the gas passages 464 of the gas scrubber 46 (while the contaminants in the cleaning gas are filtered) and then exit the vessel 36 through the gas outlet 42.

Accordingly, a self-cleaning process is performed so as to remove contaminants accumulated on the collector 32. Moreover, the result of the self-cleaning process is also improved due to the use of the gas scrubber 46 described above.

The embodiments of the present disclosure have some advantageous features: by using a gas scrubber that has different pitches between ribs at different locations, especially with the ribs close to the gas outlet(s) having a smaller pitch than the ribs away from the gas outlet(s), the distribution of the cleaning gas flow within the vessel of the EUV radiation source can be improved. As a result, the effect of the self-cleaning process performed is also improved, thereby increasing the lifetime of the collector and the productivity of the lithography system.

In some embodiments, an extreme ultraviolet radiation source is provided, including a vessel and a gas scrubber. The vessel has a gas inlet from which a cleaning gas is supplied into the vessel and a gas outlet from which the cleaning gas exits the vessel. The gas scrubber is disposed within the vessel, arranged such that the cleaning gas leaves the vessel through the gas outlet after flowing through the gas scrubber. The gas scrubber has a number of gas passages to allow the cleaning gas to flow through, and the sizes of the gas passages vary according to the distance between each of the gas passages and the gas outlet.

In some embodiments, an extreme ultraviolet radiation source is provided, including a vessel and a gas scrubber. The vessel has a gas inlet from which a cleaning gas is supplied into the vessel and a gas outlet from which the cleaning gas exits the vessel. The gas scrubber is disposed within the vessel and on the flow path of the cleaning gas. The gas scrubber is a ring structure including a number of ribs distributed along the circumference of the ring structure and a number of gas passages formed between the ribs. The ribs have different pitches in the circumferential direction of the ring structure.

In some embodiments, a method of cleaning an extreme ultraviolet radiation source is provided, including providing the extreme ultraviolet radiation source, which includes a vessel having a gas supply for supplying a cleaning gas and a gas outlet for discharging the cleaning gas, and a gas scrubber disposed within the vessel and on the flow path of the cleaning gas. The method further includes providing the cleaning gas into the vessel. The method also includes flowing the cleaning gas out of the vessel after the cleaning gas passes through the gas scrubber. In addition, the gas scrubber has a number of gas passages to allow the cleaning gas to flow through, and the sizes of the gas passages vary according to a distance between each of the gas passages and the gas outlet.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may vary while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An extreme ultraviolet radiation source, comprising:
   a vessel configured to produce extreme ultraviolet light therein, wherein the vessel has a gas supply from which a cleaning gas is supplied into the vessel and a gas outlet from which the cleaning gas exits the vessel;
   a vacuum pump coupled to the gas outlet; and
   a gas scrubber disposed within the vessel, arranged such that the cleaning gas leaves the vessel through the gas outlet after flowing through the gas scrubber;
   wherein the gas scrubber has a plurality of ribs and a plurality of gas passages to allow the cleaning gas to flow through, wherein the ribs form the gas passages therebetween, and sizes of the gas passages vary according to a distance between each of the gas passages and the gas outlet.

2. The extreme ultraviolet radiation source as claimed in claim 1, wherein a size of the gas passage close to the gas outlet is smaller than a size of the gas passage away from the gas outlet.

3. The extreme ultraviolet radiation source as claimed in claim 1, wherein the gas scrubber is a ring structure comprising the plurality of ribs distributed along a circumference of the ring structure.

4. The extreme ultraviolet radiation source as claimed in claim 3, wherein the ribs comprise a plurality of first ribs close to the gas outlet and a plurality of second ribs away from the gas outlet, wherein a first pitch is formed between the first ribs, and a second pitch is formed between the second ribs, the first pitch being smaller than the second pitch.

5. The extreme ultraviolet radiation source as claimed in claim 4, wherein the ribs further comprise a plurality of third ribs between the first ribs and the second ribs, and a third pitch is formed between the third ribs, wherein the third pitch is smaller than the second pitch and greater than the first pitch.

6. The extreme ultraviolet radiation source as claimed in claim 1, wherein the size of the gas passage that is farthest from the gas outlet is about twice the size of the gas passage that is closest to the gas outlet.

7. The extreme ultraviolet radiation source as claimed in claim 2, wherein the vessel further has a plurality of gas outlets, and the gas passages close to the gas outlets are smaller than the gas passages away from the gas outlets.

8. The extreme ultraviolet radiation source as claimed in claim 7, wherein the vessel is cylindrical, and the gas outlets are formed at equal intervals around the vessel.

9. The extreme ultraviolet radiation source as claimed in claim 3, wherein the gas scrubber further comprises a shielding member movably mounted on the circumference of the ring structure to cover some of the gas passages.

10. The extreme ultraviolet radiation source as claimed in claim 1, wherein the gas scrubber is positioned in an inner wall of the vessel that is configured to limit a propagation region of the extreme ultraviolet light within the vessel.

11. The extreme ultraviolet radiation source as claimed in claim 1, further comprising a gas source coupled to the gas supply.

12. The extreme ultraviolet radiation source as claimed in claim 1, further comprising:
    a droplet generator configured to generate a plurality of target droplets within the vessel; a laser source configured to generate a laser beam to heat the target droplets to produce the extreme ultraviolet light; and
    an optical collector disposed in the vessel and configured to collect and reflect the extreme ultraviolet light produced in the vessel.

13. An extreme ultraviolet radiation source, comprising:
    a vessel configured to produce extreme ultraviolet light therein, wherein the vessel has a gas supply from which a cleaning gas is supplied into the vessel and a gas outlet from which the cleaning gas exits the vessel;
    a vacuum pump coupled to the gas outlet; and
    a gas scrubber disposed within the vessel and on a flow path of the cleaning gas;
    wherein the gas scrubber is a ring structure comprising a plurality of ribs distributed along a circumference of the ring structure and a plurality of gas passages formed between the ribs, wherein the ribs have different pitches in a circumferential direction of the ring structure.

14. The extreme ultraviolet radiation source as claimed in claim 13, wherein the vessel is cylindrical and has a central axis, and the gas scrubber is disposed around the central axis, wherein an angle that is greater than 0 degrees is formed between each of the ribs and the central axis.

15. The extreme ultraviolet radiation source as claimed in claim 13, wherein a pitch formed between the ribs close to the gas outlet is smaller than a pitch formed between the ribs away from the gas outlet.

16. The extreme ultraviolet radiation source as claimed in claim 15, wherein a ratio of the pitch formed between the ribs close to the gas outlet to the pitch formed between the ribs away from the gas outlet is from 1:1.1 to 1:2.

17. The extreme ultraviolet radiation source as claimed in claim 13, wherein a shielding member is movably mounted on the circumference of the gas scrubber to cover some of the gas passages.

18. The extreme ultraviolet radiation source as claimed in claim 13, wherein the gas scrubber is positioned in an inner wall of the vessel that is configured to limit a propagation region of the extreme ultraviolet light within the vessel.

19. The extreme ultraviolet radiation source as claimed in claim 18, wherein the gas scrubber has a circular opening to allow the extreme ultraviolet light to pass through.

20. A method of cleaning an extreme ultraviolet radiation source, comprising:
    providing the extreme ultraviolet radiation source, which comprises a vessel having a gas supply for supplying a cleaning gas and a gas outlet for discharging the cleaning gas, and a gas scrubber disposed within the vessel and on a flow path of the cleaning gas;
    providing the cleaning gas into the vessel; and discharging the cleaning gas out of the vessel after the cleaning gas passes through the gas scrubber using a vacuum pump;

wherein the gas scrubber has a plurality of ribs and a plurality of gas passages to allow the cleaning gas to flow through, wherein the ribs form the gas passages therebetween, and sizes of the gas passages vary according to a distance between each of the gas passages and the gas outlet.

* * * * *